(12) United States Patent
Cheng et al.

(10) Patent No.: US 10,295,611 B2
(45) Date of Patent: May 21, 2019

(54) EFFICIENT BATTERY TESTER

(71) Applicant: Premier Technologies, Ltd., Kwai Chung, N.T. (HK)

(72) Inventors: Chun Sing Cheng, Tin Shui Wai (HK); Wing Hong Lau, Shatin (HK); Shu Hung Henry Chung, Mid-levels (HK)

(73) Assignee: PREMIER TECHNOLOGIES, LTD., Kwai Chung, N.T. (HK)

( * ) Notice: Subject to any disclaimer, the term of this patent is extended or adjusted under 35 U.S.C. 154(b) by 303 days.

(21) Appl. No.: 15/134,025

(22) Filed: Apr. 20, 2016

(65) Prior Publication Data

US 2016/0363634 A1 Dec. 15, 2016

Related U.S. Application Data

(60) Provisional application No. 62/173,222, filed on Jun. 9, 2015.

(51) Int. Cl.
*G01R 31/36* (2019.01)
*G01R 31/392* (2019.01)
(Continued)

(52) U.S. Cl.
CPC ....... *G01R 31/392* (2019.01); *G01R 31/3647* (2019.01); *G01R 31/3648* (2013.01); *G01R 31/385* (2019.01); *G01R 31/389* (2019.01)

(58) Field of Classification Search
CPC ......... H02M 3/156; H02M 2001/0045; H02M 1/44; H02M 2001/007; H02M 3/158; H02M 1/08; H02M 1/10; H02M 1/12; H02M 1/143; H02M 2001/0009; H02M 2001/0029; H02M 2001/0038; H02M 2001/0054; H02M 3/155; H02M 3/33523; H02M 5/2573; H02M 5/42; H02M 5/458; H02M 1/15; H02M 1/4225; H02M 2001/0058; H02M 2001/0087; H02M 2003/072; H02M 3/07; H02M 3/335; H02M 3/3376; H02M 7/217; H02M 7/4807; H05B 41/36; H05B 41/3927; H05B 37/03; H05B 41/282; H05B 41/2825; H05B 41/3921;
(Continued)

(56) References Cited

U.S. PATENT DOCUMENTS 6,384,608 B1 5/2002 Namaky
6,411,098 B1 6/2002 Laletin
(Continued)

FOREIGN PATENT DOCUMENTS

| CN | 101276944 | 10/2008 |
|---|---|---|
| CN | 103424712 | 12/2013 |
| CN | 203658549 | 6/2014 |
| CN | 204287437 | 4/2015 |
| JP | 2014154437 | 8/2014 |

*Primary Examiner* — Robert G Bachner
(74) *Attorney, Agent, or Firm* — Cislo & Thomas, LLP

(57) ABSTRACT

A battery tester for efficiently extracting intrinsic characteristics of a battery. The battery tester comprises a sensing unit, a controller, bi-directional power converter, and an energy storage unit so that energy discharged from a battery during testing is stored in the energy storage unit and recycled back to the battery. The battery tester uses a high current pulse test and a switching excitation test with a modified particle arm optimization algorithm to analyze precise model parameters that can be used to describe the health conditions of a battery.

20 Claims, 9 Drawing Sheets

(51) Int. Cl.
    *G01R 31/389* (2019.01)
    *G01R 31/385* (2019.01)

(58) Field of Classification Search
    CPC ............ H05B 33/0815; H05B 33/0818; H05B
            33/0821; H05B 33/0824; H05B 33/0845;
            H05B 41/2827; H05B 41/2855; H05B
            41/391; H05B 41/3924; H05B 41/3925;
            H05B 33/0809; H05B 33/0896; H05B
            41/2856; G01R 31/2849; G01R 19/2513;
                G01R 31/245; G01R 27/02; G01R
            31/3627; G01R 31/3648; G01R 31/3662;
                G01R 31/3679; G01R 31/3693; H01F
                                    30/04; H01F 38/14
    See application file for complete search history.

(56) References Cited

U.S. PATENT DOCUMENTS

| | | |
|---|---|---|
| 7,236,823 B2 | 6/2007 | Herbert |
| 7,635,983 B2 | 12/2009 | Pecile |
| 7,928,735 B2 | 4/2011 | Huang et al. |
| 2005/0134282 A1 | 6/2005 | Averbuch |
| 2013/0141107 A1 | 6/2013 | Yuasa |
| 2013/0257383 A1 | 10/2013 | Shim |
| 2014/0055143 A1* | 2/2014 | Shieh ................ G01R 31/3627 324/426 |
| 2014/0111015 A1* | 4/2014 | Fall ................ H01L 31/02021 307/66 |

* cited by examiner

EFFICIENT BATTERY TESTER

CROSS-REFERENCE TO RELATED APPLICATION

This patent application claims the benefit of U.S. Provisional Patent Application Ser. No. 62/173,222, entitled "Efficient Battery Tester," filed Jun. 9, 2015, which is incorporated in its entirety here by this reference.

TECHNICAL FIELD

This invention relates to an apparatus for determining the health status of a battery.

BACKGROUND

Conventional battery testers are generally wasteful in terms of energy. Evaluating the operating conditions of a battery generally includes measuring the voltage change between a loading period and a recovery period when it is connected to a load. A typical load consumes all energy delivered to it. This type of testing results in energy loss through the dissipative load and limited information gathered about the health status of a battery.

Each current method of testing batteries has additional limitations. The DC load method of testing batteries requires a high power rating resistor connected to the battery under test to measure the voltage and current. However, the resistor heats up over time, and the battery status cannot be represented accurately. The AC conductance method injects an AC signal between 80 Hz to 100 Hz using an RC-network circuit. However, this method does not consider the charging status of the battery under test and cannot obtain individual parameters of the model. The electro-chemical impedance spectroscopy (EIS) method injects multiple frequencies between 20 Hz to 2000 Hz using an RC-network circuit a and is able to establish all parameters in the RC network circuit. However, the testing period is long due to the multiple frequencies used, and it does not consider and test any charging status of the battery under test.

For the foregoing reasons there is a need for a battery tester that is more efficient and considers more information relevant to calculating the health status of a battery.

SUMMARY

The present invention is directed to an efficient battery tester for efficiently extracting intrinsic characteristics of a battery. The efficient battery tester may be used by battery manufacturers, automobile shops, or end users to test different types of batteries, including SLI (Starting, Lighting, Ignition), Gel Cell, and AGM (Absorbed Glass Mat) batteries. The efficient battery tester comprises a sensing unit, a controller, a bi-directional power converter, and an energy storage unit so that energy discharged from a battery during testing is stored in the energy storage unit and recycled back to the battery. The efficient battery tester uses a high current pulse test and a switching excitation test with a modified particle swarm optimization algorithm to analyze precise model parameters that can be used to describe the health conditions of a battery.

DETAILED DESCRIPTION OF THE INVENTION

The detailed description set forth below in connection with the appended drawings is intended as a description of presently-preferred embodiments of the invention and is not intended to represent the only forms in which the present invention may be constructed or utilized. The description sets forth the functions and the sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

Figure 1:
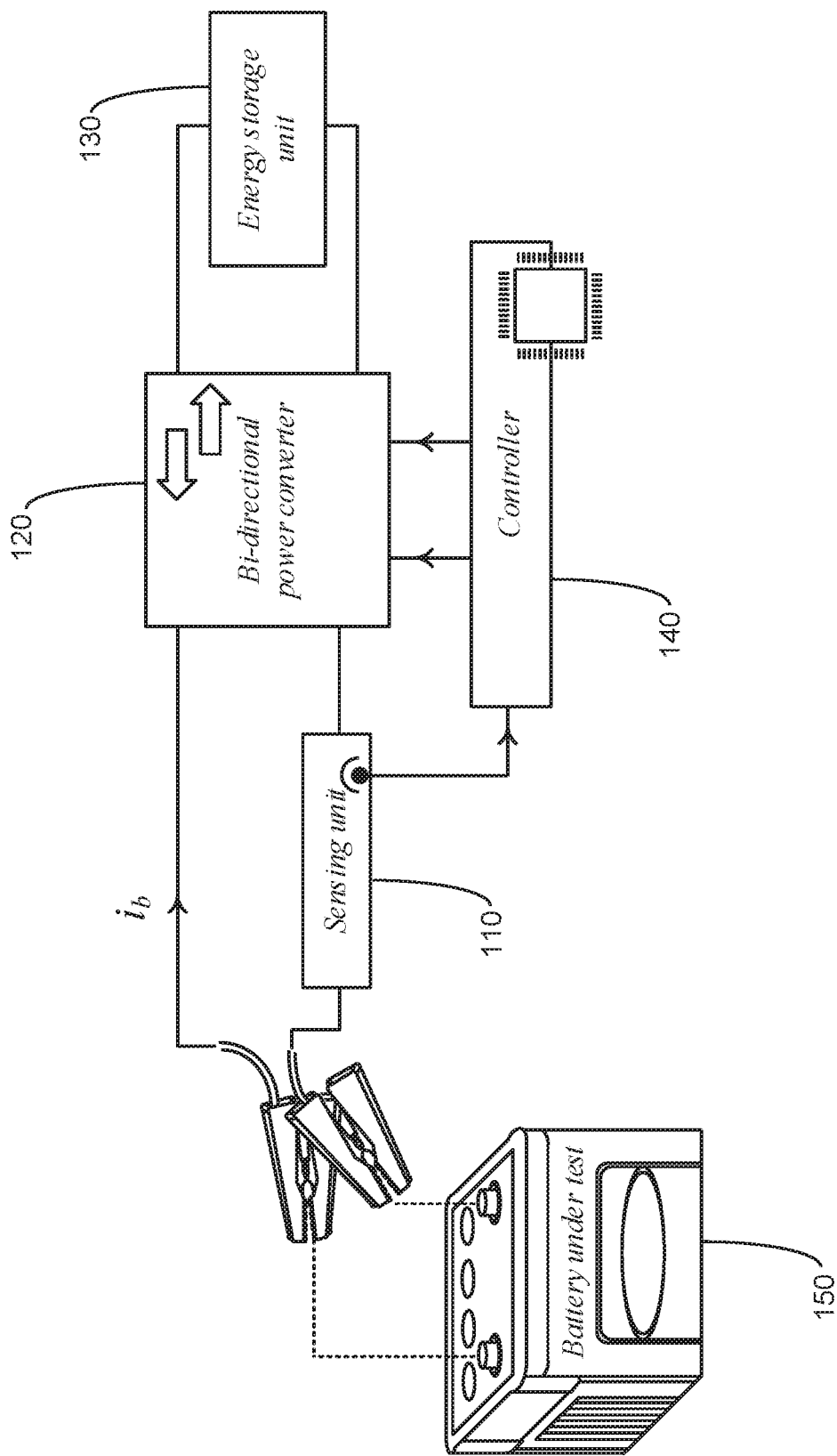
FIG. 1 shoes a block diagram of an embodiment of the present disclosure.

The present invention is an efficient battery tester 100 that may be used for testing a battery under test (BUT) 150 during charging and discharging periods in order to save energy and calculate the BUT intrinsic characteristics. As shown in FIG. 1, the efficient battery tester 100 comprises a sensing unit 110, a controller 140, a bi-directional power converter 120, and an energy storage unit (ESU) 130. The ESU 130 is used to store the energy drawn from the BUT 150 during discharging mode, and then to charge the BUT 150 during charging mode. The bi-directional power converter 120 is used as a bi-directional controlled conversion platform to facilitate the power conversion from the BUT 150 to the ESU 130 in discharging mode and from the ESU 130 to the BUT 150 in charging mode. The sensing unit 110 measures the voltage and current for further parameter analysis. The controller 140 controls the operation of the bi-directional power converter 120 in order to achieve charging or discharging mode, and receives measurements from the sensing unit 110 to calculate the intrinsic parameters of the BUT 150 using intelligent algorithms.

Battery Equivalent Models

Multiple battery equivalent models may be used to evaluate the health conditions of a battery. For example, a "fast mode" operation may be used for speedy measurements and rough evaluation of the battery status, while a "professional mode" operation may be used to provide a more accurate evaluation of the battery conditions.

Figure 2:
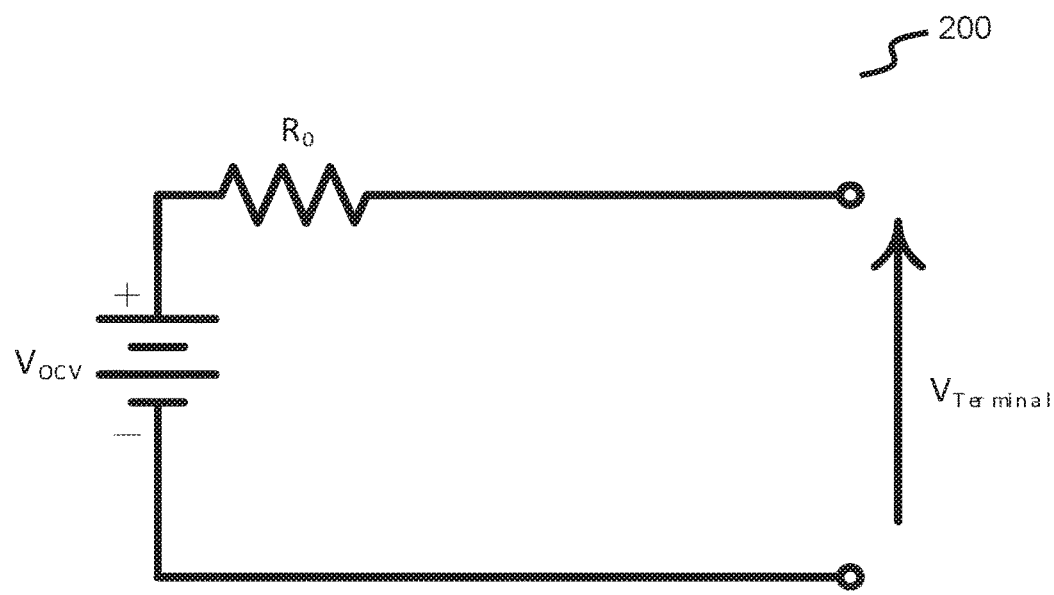
FIG. 2 shows a simple battery equivalent model used in a first mode of operation for speedy evaluation of a battery status in accordance with an embodiment of the present disclosure.

The "fast mode" operation is used to provide a speedy analysis of the battery condition. As shown in FIG. 2, a "fast mode" operation may use a simple battery equivalent model 200 to determine the battery status. This model can be used in unsophisticated testers with Ohm's law to determine the battery status. This model has low implementation complexity and short computation time. However, the results will only be a rough evaluation of the battery condition.

Figure 3:
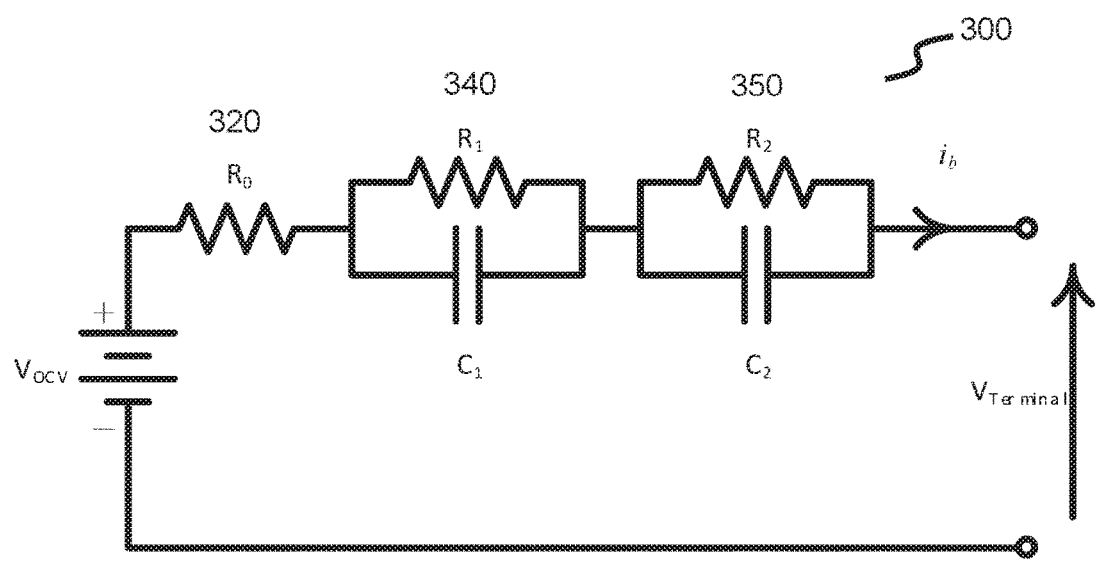
FIG. 3 shows a complex battery equivalent model used in a second mode of operation for accurate evaluation of a battery status in accordance with an embodiment of the present disclosure.

The "professional mode" is used to more accurately evaluate the battery condition. As shown in FIG. 3, a "professional mode" operation may use a complex battery equivalent model 300. In a preferred embodiment, this battery equivalent model uses an ideal battery (a pure capacitor), a series resistor 320, a first resistor-capacitor parallel network 340 and a second resistor-capacitor parallel network 350 for better evaluating high frequency response under switching excitation operation. While two resistor-capacitor parallel networks are considered here, resistor-capacitor parallel networks may be added or removed to the battery equivalent model in accordance with embodiments of the present invention. When the complex battery equivalent model 300 is used with an advanced algorithm, such as the particle swarm optimization (PSO) algorithm, the internal parameters of the battery may be more accurately evaluated.

Battery Testing Method

The efficient battery tester 100 is capable of using a plurality of testing methods. In particular, the efficient battery tester 100 is capable of using testing methods that involve draining and charging the battery. For example, the efficient battery tester 100 may use a high current pulse test and/or a switching excitation test in order to determine the intrinsic parameters of the BUT 150. The high current pulse test draws a high current from the BUT 150 in a short pulse. The switching excitation test alternates between discharging and charging modes at a fixed frequency. These tests are used to obtain measurement data. The measurement data from these tests can be used with simple equations to provide quick estimates of intrinsic battery parameters, or it may be used with more complicated particle swarm optimization algorithms to accurately determine the intrinsic parameters using an iterative process.

Figure 4:
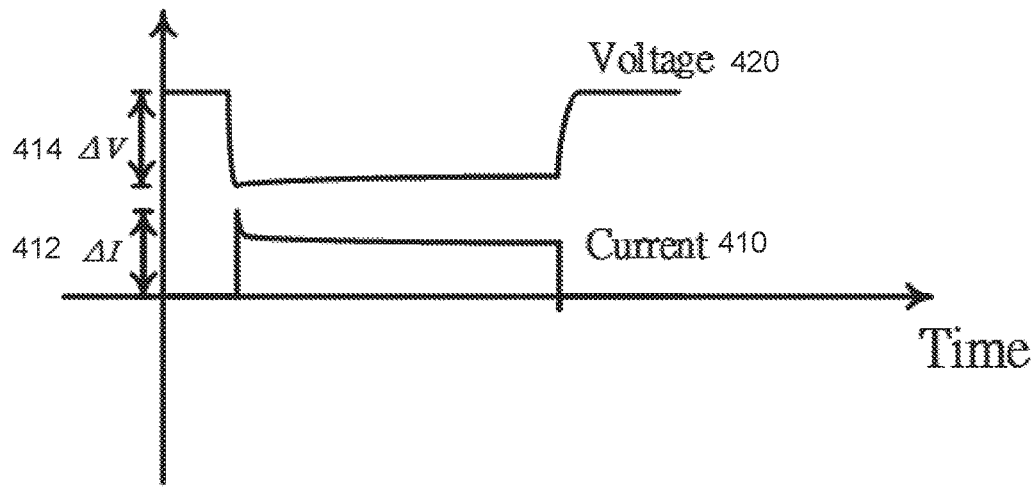
FIG. 4 shows a high current pulse test waveform in accordance with an embodiment of the present disclosure.

In the high current pulse a high en pulse is drawn from the battery for a short period of time while measuring the current 410 and voltage 420, and the current change 412 and voltage change 422 are measured. The high current pulse test is used in both the "fast mode" operation and the "professional mode" operation. The high current pulse test is used to test the delivery/cranking ability of a battery. For example, the delivery ability of a battery could be representative of a car's ignition system, which is the primary unit that draws current from a battery when starting the engine. A failure in the delivery ability of a battery could indicate that a car would be unlikely to start. As shown in FIG. 4, when a high current is drawn from a battery, the battery terminal voltage will drop to a certain level. The level of voltage drop serves as an indicator to show the capability of delivering high current in a short period of time. Therefore, the voltage change and current drawn during a pulse test can be used to estimate the delivery ability of a battery.

In the efficient battery tester 100, during the high current pulse test, a controller 140 directs the bi-directional power converter 120 to draw a surge current from the battery to the ESU 130, such as a supercapacitor. The ESU 130 will store the energy which will then be used to charge the battery during the switching excitation process. Unsophisticated battery testers use non-storage loads (e.g. resistor) that waste the energy by converting the energy drawn into heat. Consequently, this pulse generation method using an ESU 130 can reduce the e energy loss and avoids heating problems during high current testing.

Figure 5:
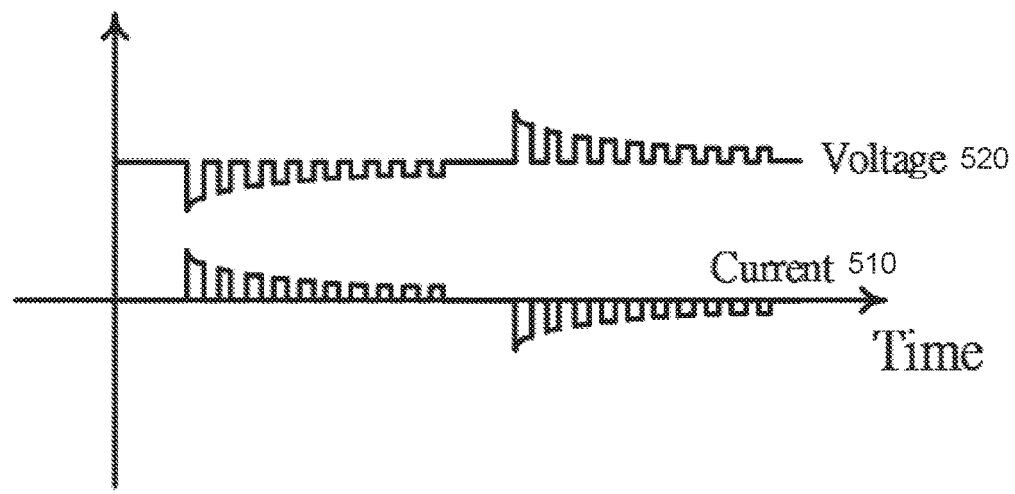
FIG. 5 shows a switching excitation test waveform in accordance with an embodiment of the present disclosure.

In the switching excitation test, the efficient battery tester 100 alternates between discharging and charging modes at a fixed frequency, as shown in FIG. 5. This switching excitation operation is designed to excite the components of the two RC parallel networks of the equivalent model, while measuring the current 510 and voltage 520 to determine the current change and voltage change. The switching excitation test s used in the "professional mode" operation.

The switching excitation operation does not require an external power source, as energy stored in the ESU 130 will be used during battery charging operation. Additionally, this method does not require sweeping of multiple frequencies, as it operates at a fixed frequency, such as a 100 kHz DC switching signal.

Battery Status Estimation Algorithm

With the measured data, several indicators including cold cranking amperes (CCA), impedance of battery and state of charge (SOC) can be estimated. These are calculated differently in the "fast mode" operation and the "professional mode" operation.

The "fast mode" operation is used for a quick estimation of a battery's health condition. In this "fast mode" operation, the high current pulse test is used to measure voltage change and current. The internal characteristics are then calculated using a simple battery equivalent model 200. The battery internal resistance (R) is calculated using the change in voltage ($\Delta V$) and the change in current ($\Delta I$) in the following equation:

Battery internal resistance:

$$R = \frac{\Delta V}{\Delta I} \quad (1)$$

The CCA is then calculated based on the battery internal resistance. The cold cranking ampere may take into consideration the terminal voltage, cutoff voltage, and temperature compensation. For example, according to international CCA standards (IEC), battery voltage should not be lower than 8.4V at $-18°$ C. ($0°$ F.). The CCA value can be calculated using ohms law with temperature compensation, using a temperature corrected function of the terminal voltage ($V_{Terminal}$) and the cutoff voltage ($V_{cutoff}$) in the following equation:

Cold Cranking Ampere:

$$CCA = \frac{f(V_{Terminal} - V_{cutoff})_{temp-correct}}{R} \quad (2)$$

Figure 6:
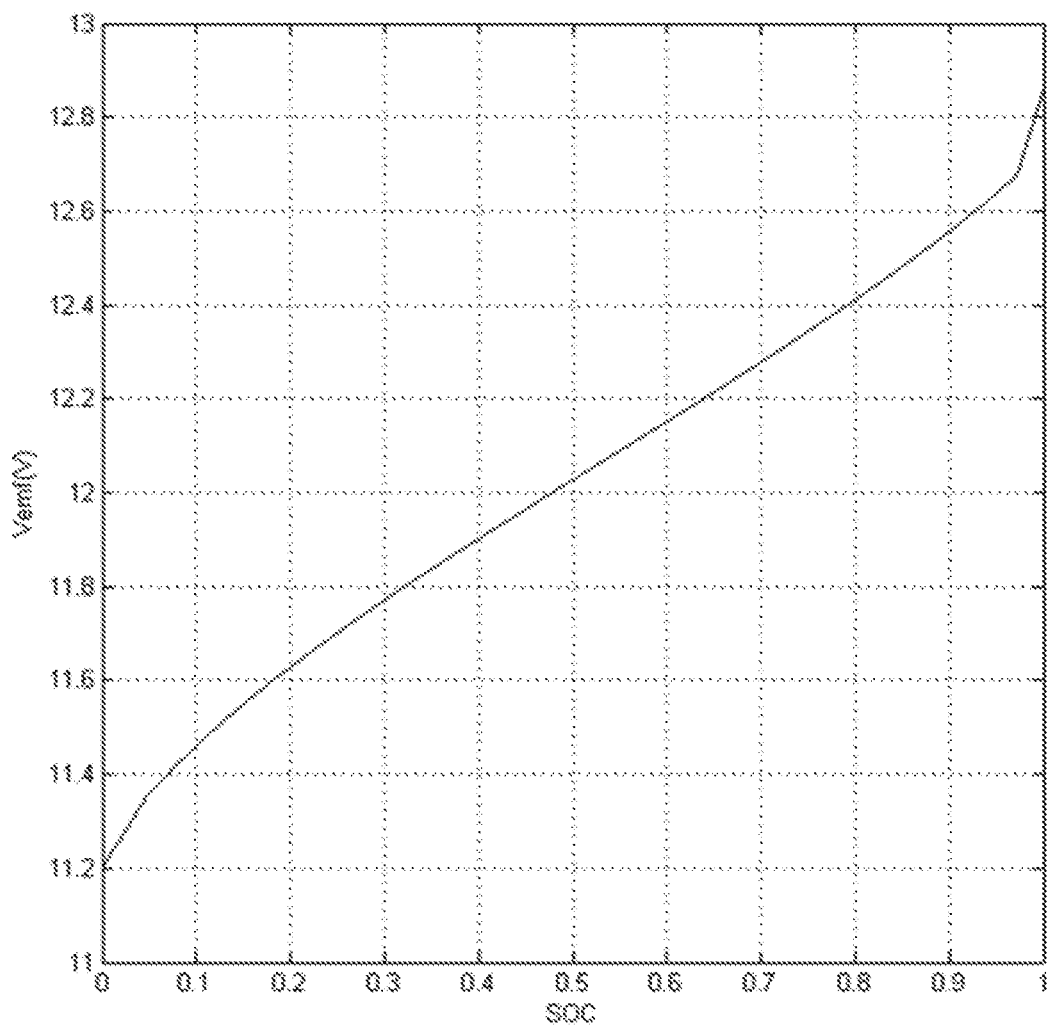
FIG. 6 shows a SOC-VOC lookup table for lead-acid batteries.

The state-of-charge (SOC) of a battery can be evaluated using a function associated with the terminal voltage and a SOC-VOC lookup table, such as in FIG. 6.

$$\text{State of Charge: } SOC = f(V_{Terminal})_{temp-correct} \quad (3)$$

Using the simple battery equivalent model 200, voltage change, and current measurements, all calculations can be completed quickly with test results being computed in minimal time. However, this "fast mode" operation is only provides estimates of a battery's health condition and lacks precision.

The "professional mode" operation is used for a more precise measure of a battery's health condition, for the "professional mode" operation, both the high current pulse test and switching excitation test are used to measure data. The internal characteristics are calculated using the complex battery equivalent model 300. The computations used for the complex battery equivalent model 300 and the particle swarm optimization algorithm are more resource intensive and time consuming.

The series resistor Ro is used to model the instantaneous voltage drop upon a sudden load change. The parallel RC networks formed by the resistors R1, R2 and the capacitors C1, C2 are used to model the transient response these parameters characterize the steady-state and transient behaviors of the battery exhibiting multiple time constants.

Thus, the time constants $\tau_k$ of the k-th network is:

$$\tau_k = R_k C_k \tag{4}$$

Based on Kirchhoff's voltage law, the voltages on the RC networks are:

$$V_k(t) = \frac{1}{C_k} \int_0^t \left[ i_b(\theta) - \frac{V_k(\theta)}{R_k} \right] d\theta + V_k(0) \tag{5}$$

where $V_k(t)$ is the voltage across $C_k$ and $i_b$ is the battery current and k=1 or 2.

The terminal voltage of the battery $V_{Terminal}$ can be expressed as:

$$V_{Terminal}(t) = V_{ocv}[SOC(t)] + i_b(t)R_o + \sum_{k=1}^n V_k(t) \tag{6}$$

where $$V_{ocv}[SOC(t)] = \int_0^t \frac{i_b(\theta)}{C[SOC(\theta)]} d\theta + V_{ocv}[SOC(0)] \tag{7}$$

and SOC(θ) is the state of charge at time θ, C[SOC(θ)] is the ideal battery capacitance change at different SOC.

Figure 7:
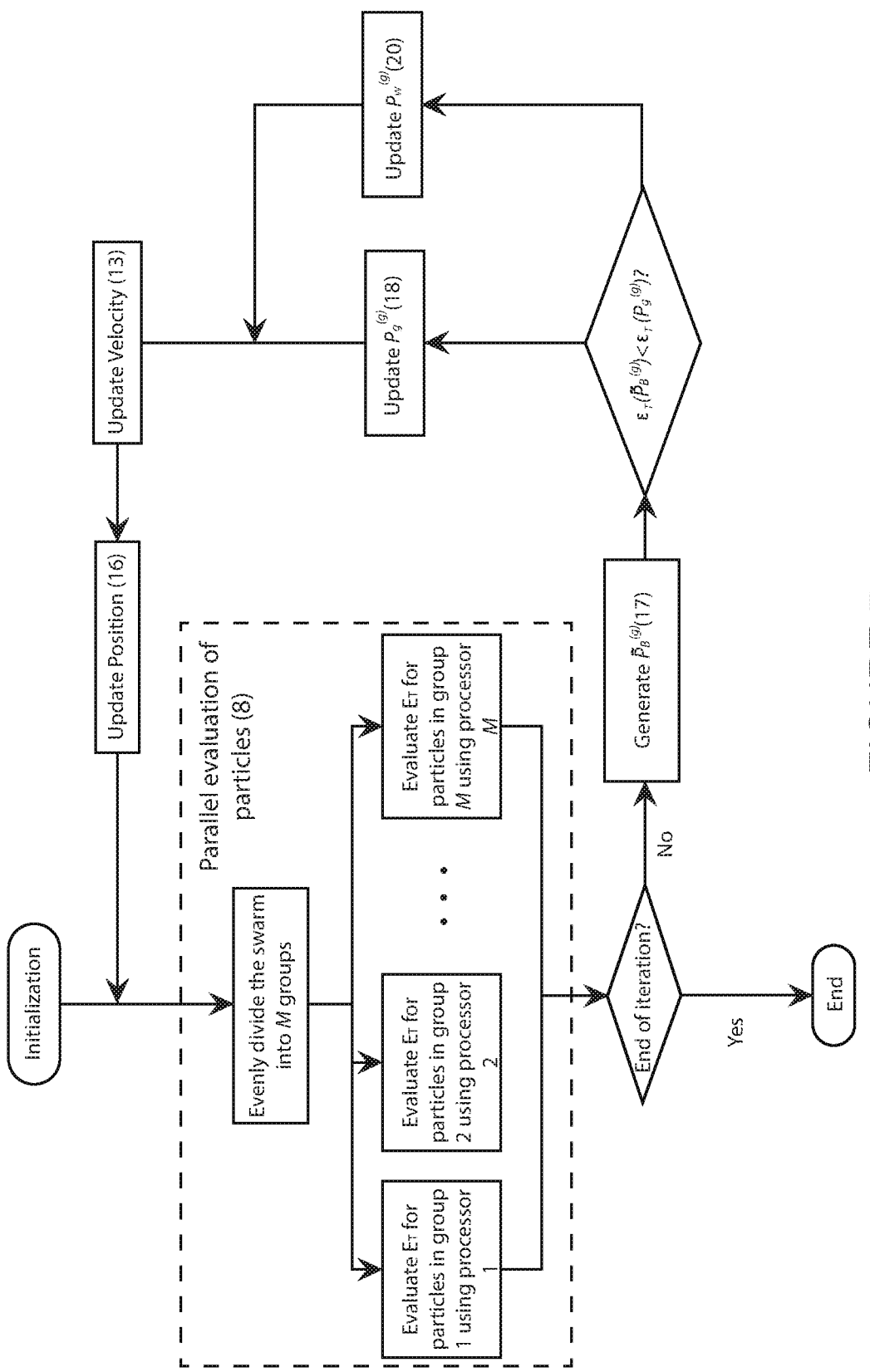
FIG. 7 shows a flow diagram for a modified particle swarm optimization algorithm in accordance with an embodiment of the present disclosure.
Figure 8:
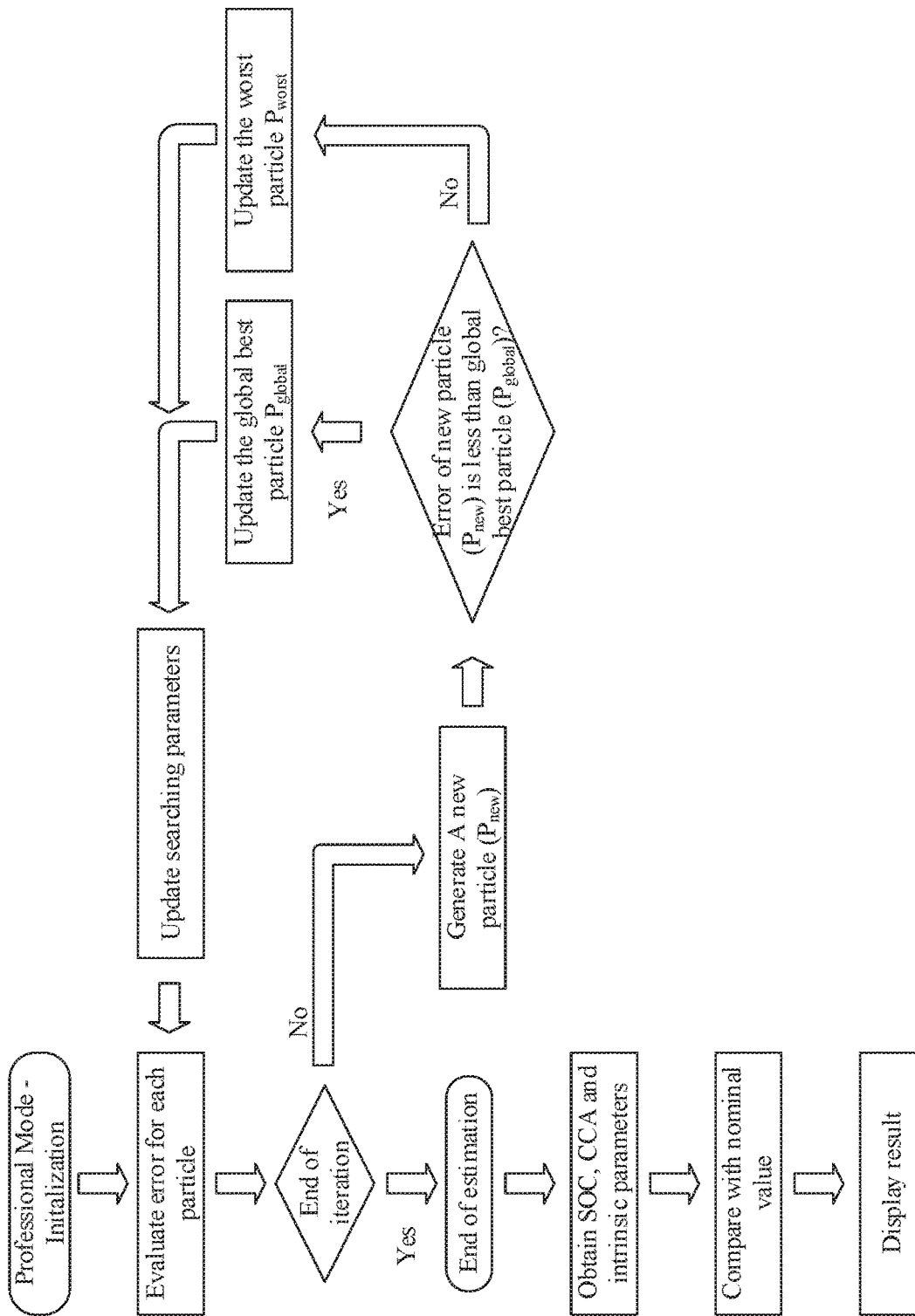
FIG. 8 shows a flow diagram of a professional mode operation process in accordance with an embodiment of the present invention.

With the complex battery equivalent model 300, a modified particle swarm optimization algorithm is used for solving the battery parameters without known derivatives and is feasible for time-critical applications. The particle swarm optimization algorithm is an iterative process that mimics the behavior of a swarm of agents searching for an objective. An agent in the swarm cooperates with others by sharing some of the information it knows about the objective, and uses the information shared by others to guide its search. As the iteration progresses, the whole swarm tends to converge towards the objective. In order to avoid being trapped in local optima, the present invention uses a modified particle swarm optimization algorithm that introduces perturbations. This flowchart for "professional mode" operation that uses the modified particle swarm optimization algorithm is depicted in FIG. 8. The flow chart for the modified particle swarm optimization algorithm is shown in FIG. 7.

Definition of the Objective Function and Parameter Set

An objective function $\varepsilon_T$ is used to measure and quantify the difference between the actual battery voltage-current characteristics and the one obtained by the electrical model with the estimated intrinsic parameters for a period of time T. Mathematically, $$\varepsilon_T(P) = \frac{1}{T} \int_0^T |v_{b,act}(t) - v_{b,m}[t, P, i_{b,act}(t)]| dt \tag{8}$$

where $v_{b,act}(t)$ and $i_{b,act}(t)$ are the actual battery voltage and current, respectively, measured at time t, $v_{b,m}[t, P, i_{b,act}(t)]$ is battery voltage at time t calculated by using the electrical model with the parameter set P under the actual battery current $i_{b,act}(t)$.

The parameter set P is optimized by the proposed modified particle swarm optimization algorithm in order to minimize $\varepsilon_T$ in equation (8). Instead of using all the circuit elements in FIG. 2, it is defined as:

$$P = [SOC(0), R_s, R_1, \ldots, R_n, \tau_1, \ldots, \tau_n, v_1(0), \ldots, v_n(0)] \tag{9}$$

where SOC(0) is the SOC at the beginning of the period. The circuit elements $C_k$ can be obtained by using equation (4) that $$C_k = \frac{\tau_k}{R_k} \tag{10}$$

The value of SOC is calculated by $$SOC(t) = SOC(0) + \frac{1}{Q_o} \int_0^t i_b(\theta) d\theta \tag{11}$$

Hence, the value of $v_{b,m}$ in equation (8) is calculated by equation (6) and equation (7). The best parameter set $P_B$ that derives the best estimates for all intrinsic parameters is the one giving minimum $\varepsilon_T$ in equation (8), $$P_B = \underset{P}{\arg\min}\, \varepsilon_T(P) \tag{12}$$

Operations of the Modified PSO

The operations of the modified particle swarm optimization algorithm are depicted in the flowchart shown in FIG. 7. The population size of the candidate parameter sets used in each optimization generation is N. Each candidate parameter set, namely particle, holds its position $P_i$, where i=1, 2, ..., N, and is associated with its velocity $V_i$. The particle velocity $V_i$ in the g-th optimization generation, $V_i^{(g)}$, is calculated by using the following formula:

$$V_i^{(g)} = w^{(g-1)} V_i^{(g-1)} + 2r_{1,i}^{(g-1)} [P_G - P_i^{(g-1)}] + 2r_{2,i}^{(g-1)} [P_{H,i}^{(g-1)} - P_i^{(g-1)}] \tag{13}$$

where $V_i^{(g-1)}$ is the particle velocity of the i-th particle in the (g-1)-th generation, $P_G$ is the global best particle so far in the optimization, $P_i^{(g-1)}$ holds the position of the i-th particle in the (g-1)-th generation, $P_{H,i}^{(g-1)}$ holds the individual best position of the i-th particle so far, $w^{(g-1)} \in (0, 1)$ is the learning factor determined by the position of the particles and its expression is given in Appendix, and $r_{1,i}^{(g-1)}$ and $r_{2,i}^{(g-1)}$ are randomly generated weighting factors distributed uniformly between 0 and 1.

$P_{H,i}^{(g-1)}$ in equation (13) is obtained by using the following criterion, $$P_{H,i}^{(g-1)} = \begin{cases} P_i^{(g-1)} & \text{if } \varepsilon_T(P_i^{(g-1)}) < \varepsilon_T(P_{H,i}^{(g-2)}) \\ P_{H,i}^{(g-2)} & \text{else} \end{cases} \quad (14)$$

while $P_G^{(g-1)}$ is obtained by the following criterion, $$P_G^{(g-1)} = \underset{P_{H,i}^{(g-1)}}{\arg\min} \varepsilon_T(P_{H,i}^{(g-1)}), \text{ for } i = 1, 2, \ldots, N. \quad (15)$$

By using equation (13), the particles are updated by using the following formula $$P_i^{(g)} = P_i^{(g-1)} + V_i^{(g)} \quad (16)$$

The particles are not allowed to exceed the searching boundaries, so the velocities of the particles who reach the boundaries are reversed. To avoid the search trapping into local optima, a perturbation technique is applied. The algorithm is described as follows. Before all particles have been updated by using equation (15), a new particle $\tilde{P}_B^{(g)}$ is formed by injecting a randomly-generated perturbation $\delta p^{(g)}$ into $P_G^{(g)}$, $$\tilde{P}_B^{(g)} = P_G^{(g)} + \delta p^{(g)} \quad (17)$$

If $\varepsilon_T(\tilde{P}_B^{(g)}) < \varepsilon_T(P_G^{(g)})$, i.e., particle $\tilde{P}_B^{(g)}$ is better than $P_G^{(g)}$, substitute the best particle in $\{P_G^{(g)} + \delta p^{(g)}, P_G^{(g)} + 2\delta p^{(g)}, P_G^{(g)} + 4\delta p^{(g)}, \ldots, P_G^{(g)} + 2^k \delta p^{(g)}\}$ for $P_G^{(g)}$, where $P_G^{(g)} + 2^k \delta p^{(g)}$ is within the searching boundaries and $P_G^{(g)} + 2^{k+1} \delta p^{(g)}$ is out of the boundary $$P_G^{(g)} = \underset{p}{\arg\min} \varepsilon_T(p), \quad (18)$$

subject to: $p = P_G^{(g)} + 2^i \delta p^{(g)}$ where $i = 0, \ldots, k$

Otherwise, the worst particle $P_W^{(g)}$ in the current generation, which is identified as:

$$P_W^{(g)} = \underset{P_i^{(g)}}{\arg\max} \varepsilon_T(P_i^{(g)}), \text{ for } i = 1, 2, \ldots, N, \quad (19)$$

will be replaced by $\tilde{P}_B^{(g)}$. That is, $$P_W^{(g)} = \tilde{P}_B^{(g)} \quad (20)$$

With the help of FIG. 7, a brief description of the steps is given as follows:

1) Searching boundaries for each parameter are set for preventing search trapping.
2) All N particles are initialized randomly.
3) All particles are evaluated by equation (8).
4) A new particle is generated by injecting perturbation into the best particle using equation (17).
5) The best or worst particle will be replaced by new particle, based on equation (18) and equation (20).
6) The velocities of all particles are calculated by equation (13), and positions are updated by equation (16),
7) The procedure is repeated from Step 2) for the next generation until the end of the iteration.

With the complex battery equivalent model 300, the model parameters are obtained by comparing the equivalent model response against the measurement. The model parameters include the impedance, value of RC networks, and open circuit voltage (OCV). These model parameters are used to accurately compute the intrinsic parameters of the battery, including impedance, CCA and SOC. Since this "professional mode" procedure of model parameters estimation is more resource intensive, this process may take more time to obtain the testing results that can accurately describe the battery's health condition. For example, in some embodiments of the present invention, the "fast mode" operation yields estimates in several seconds, while the "professional mode" operation yields results in two minutes.

Battery Tester Hardware

Figure 9:
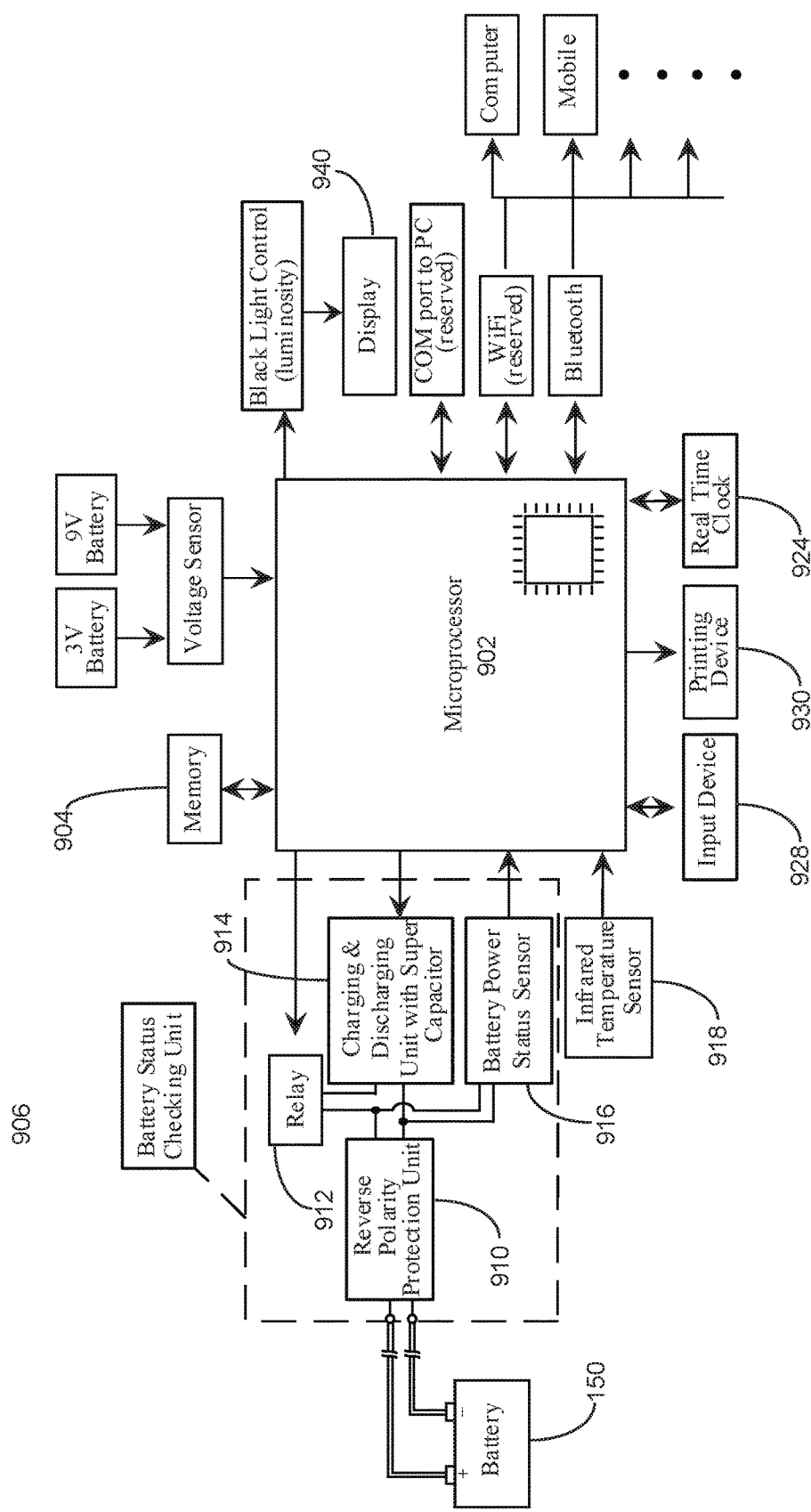
FIG. 9 shows a block diagram of an embodiment of the present disclosure.

FIG. 9 shows a block diagram of an embodiment of the efficient battery tester 100 that may be used to implement systems, apparatus, and methods described herein. This block diagram is an example embodiment that is shown for illustrative purposes only, and not for limitation.

As shown, a microprocessor 902 operatively coupled to memory 904 controls the overall operation by executing program instructions that define such operations. The program instructions may be stored in memory 904 or any other non-transitory readable medium, their loaded when execution of the program instructions is desired. Thus, the method steps can be defined by the program instruction stored in memory 904 and controlled by processor executing the computer program instructions.

The microprocessor 902 can include, among others, special purpose processors with software instructions incorporated in the processor design and general purpose processors with instructions in memory 904, to control the processor, and may be the sole processor or one of multiple processors. Processor may be a self-contained computing system, containing multiple cores or processors, a bus, memory controller, cache, etc. A multi-core processor may be symmetric or asymmetric. Processor and memory 904 may include, be supplemented by, or incorporated in, one or more application-specific integrated circuits and/or one or more field programmable gate arrays (FPGAs). It can be appreciated that the disclosure may operate with one or more processors or on a group or cluster of computers networked together to provide greater processing capability.

Memory 904 comprises a tangible on-transitory computer readable storage medium. By way of example, and not limitation, such non-transitory computer-readable storage medium can include random access memory (RAM), high-speed random access memory (DRAM), static random access memory (SRAM), double data rate synchronous dynamic random access memory (DDRRAM), read-only memory (ROM), erasable programmable read-only memory (EPROM), electrically erasable programmable read-only memory (EEPROM), flash memory, compact disc read-only memory (CD-ROM), digital versatile disc read-only memory (DVD-ROM) disks, or other optical disk storage, magnetic disk storage or other magnetic storage devices, or any other medium which can be used to carry or store desired program code means in the form of computer-executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media. Memory 904 may be used for multiple purposes, including computer instructions for performing tests, and information about users, systems, measured data, and/or test results.

A network/communication interface enables the processor to communicate with other devices over a network, such as an intranet and/or a wireless network, such as a cellular telephone network, a wireless local area network (LAN) and/or a metropolitan area network (MAN), and other devices using any suitable communications standards, protocols, and technologies. By way of example, and not limitation, such suitable communications standards, protocols, and technologies can include Ethernet, (e.g., IEEE 802.11), Wi-MAX (e.g., 802.16), Bluetooth, near field communications ("NFC"), radio frequency systems, infrared, GSM, EDGE, HS-DPA, CDMA, TDMA, quadband, VoIP, IMAP, POP, XMPP, SIMPLE, IMPS, SMS, or any other suitable communications protocols. By way of example, and not limitation, the network interface enables the processor to transfer data, synchronize information, update software, or any other suitable operation. In some embodiments, the processor transfers measurement data and/or testing results to other computing devices. This allows a user to use a mobile device or computer to examine, mail, store, and analyze measurement data and/or testing results. In addition, user may use the mobile device to search for the battery information that can be relayed back to the battery tester for testing.

An input/output interface may be used in connection with input/output devices that enable user interaction with the system. For example, an output display 940 may provide an interface platform between a user and battery tester for showing information and testing results simultaneously. An input device 928, such as a keyboard and/or touchscreen may be used to allow a user to enter information related to the battery under test 150, such as the CCA, capacity and battery type. Furthermore, users can also select different functionalities for testing and the like. A printing device 930 may be connected as a convenient way for sharing test results. Results may be printed for business records purposes or to show a customer the status of a battery.

The microprocessor 902 may also be coupled with additional hardware. A real time clock 924 may be connected to provide a time stamp for testing result and records. An external power supply may be used to power a microcontroller 902 and battery status checking unit 906 when testing deeply discharged battery. An infrared temperature sensor 918 may provide a measurement of ambient temperature for estimating CCA and SOC under temperature correction.

The microprocessor 902 is connected to the battery status checking unit 906, which is connected to the battery 150. As shown, the battery status checking unit 906 comprises a reverse polarity protection unit 910, a relay 912, a charging and discharging unit with super capacitor 914, and a battery power status sensor 916. The reverse polarity protection unit 910 prevents wrong connections between the positive and negative terminal of a battery to avoid unnecessary damage. If a wrong connection occurs, users may be alerted, such as by flashing a warning on the display. The relay 912 is a switch that enables or disables a connection between the battery 150 and the ESU 130. A charging and discharging unit with a super capacitor 914 is used for the two stages of testing operation, which are the high current pulse test and switching excitation, under the microprocessor control. A battery power status sensor 916 is used for measuring the battery voltage and current. The relevant waveforms are captured by the microprocessor 902 for future analysis.

Figure 10:
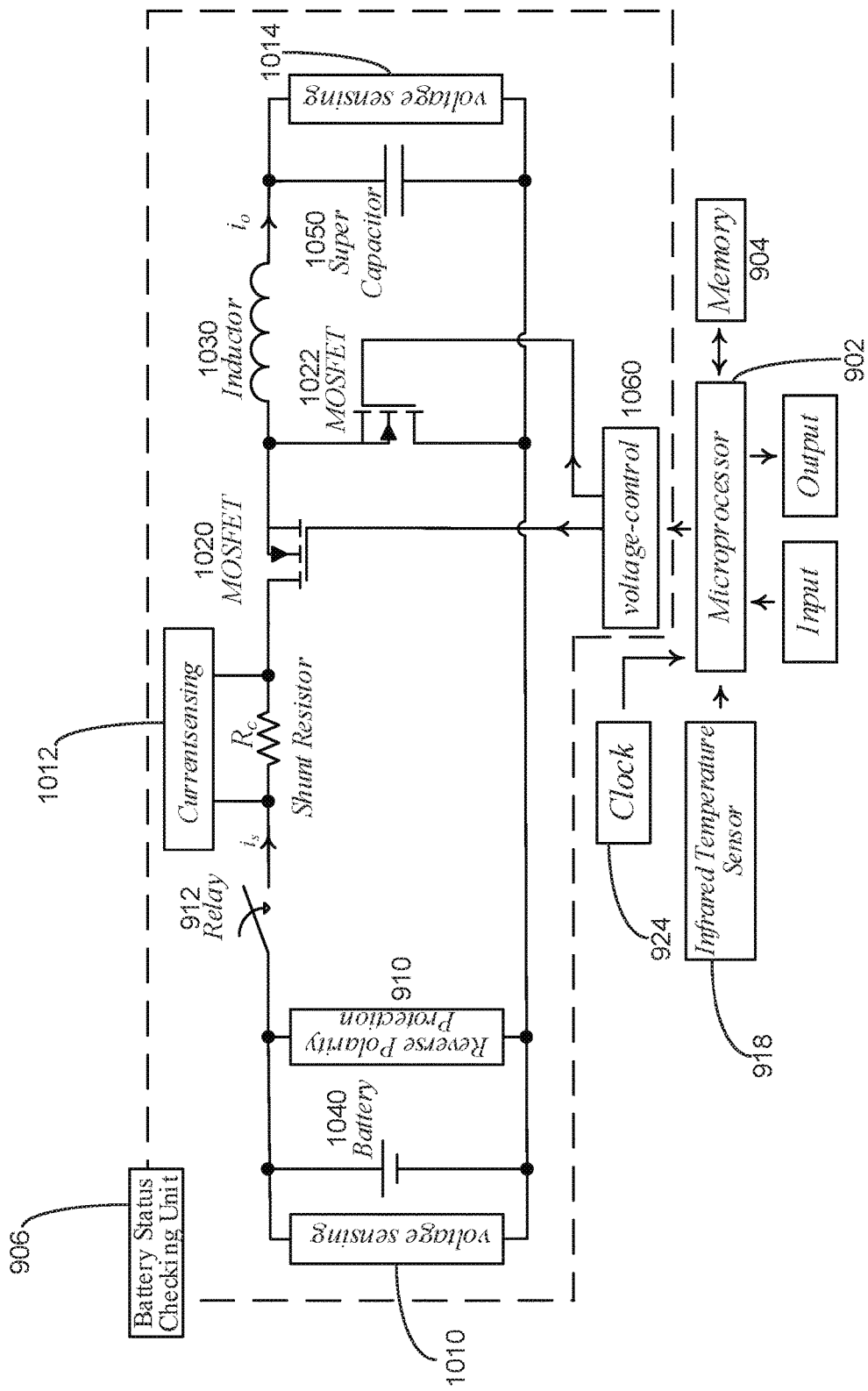
FIG. 10 shows a circuit diagram of a battery status checking unit in accordance with an embodiment of the present disclosure.

FIG. 10 shows a circuit diagram for the battery status checking unit 906 in accordance with an embodiment of the present invention. As shown, the circuit comprises a first MOSFET 1020, a second MOSFET 1022, a relay 912, an inductor 1030, and a supercapacitor 1050. The reverse polarity protection unit 910 is connected in parallel with the battery 1040. Sensing units for sensing circuit conditions are connected at various point in the circuit. These include a voltage sensor 1010 in parallel with the battery 1040, a current sensor 1012 between the relay 912 and a first MOSFET 1020, and a voltage sensor 1014 in parallel with the super capacitor 130. This circuit performs bi-directional power flow functions so that energy can be transferred from the battery 1040 to the supercapacitor 1050, and vice versa. During the discharging operation, energy is transferred from the battery 1040 to the supercapacitor 1050. The two MOSFETs are switched in a way to make the circuit operate as a buck converter with the battery 1040 treated as the source and the supercapacitor 1050 treated as the load. During the charging operation, energy is transferred from the supercapacitor 1050 to the battery 1040. The two MOSFETs are switched in a way to operate the circuit as a boost converter with the supercapacitor 1050 treated as the source and the battery 1040 treated as the load. The voltage-control 1060 controls the MOSFETs so that the high current pulse test and switching excitation test may be performed.

Figure 11:
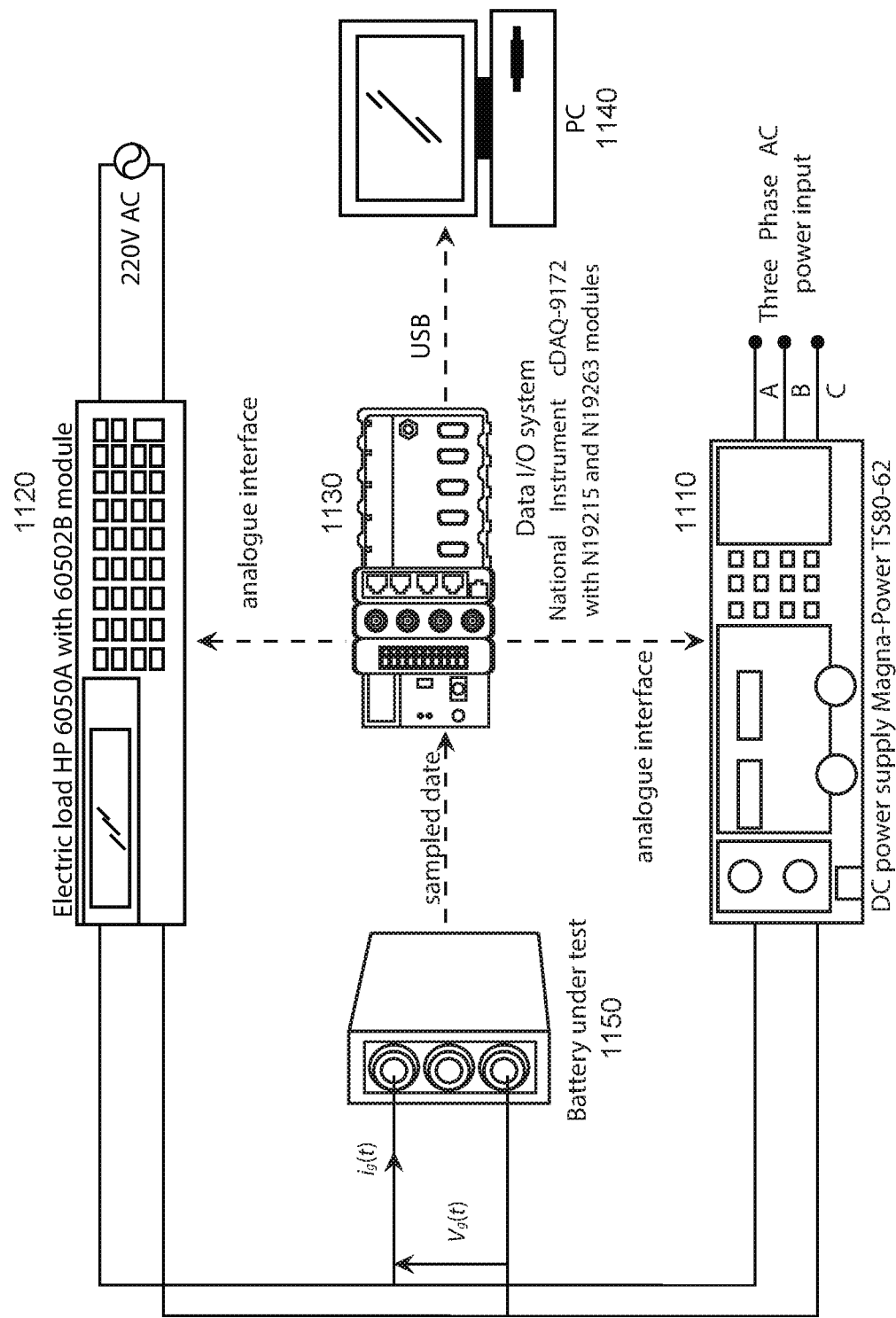
FIG. 11 shows an experimental setup used to verify the results during the testing process.

FIG. 11 shows an experimental setup used to verify the testing process using different types of batteries. The battery under test is connected to a power supply Magna-Power TS80-62 1110 and an electronic Hewlett Packard HP6050 A mainframe with a 60502B load module 1120. The power supply 1110 is used to program the charging current for the battery under test, while the electronic mainframe with an electronic load 1120 is used to program the load current drawn from the battery under test. This arrangement can emulate real working conditions where battery charging and discharging can take place in an application, such as EV. The power supply 1110 and the mainframe with an electronic load 1120 are controlled by a computer 1140 through the controller National Instruments NI 9263, which is installed on an NI cDAQ-9172 chassis 1130 using USB connection. The current patterns are programmed on the computer 1140. The battery voltage and current (converted to voltage signal using a 0.1 ohm resistor) are sampled by a data acquisition module National Instruments NI 9215 which is also installed on the cDAQ-9172 chassis 1130. Both the resolution of both NI 9215 and NI 9263 is 16 bit, operating in the range of ±10 V. Using this setup with multiple battery current patterns under multiple SOC conditions, studies have shown that average prediction errors are less than 0.5% of the battery voltage. Thus, the efficient battery tester has proven its performance is within the practical range for such applications.

The foregoing description of the preferred embodiment of the invention has been presented for the purposes of illustration and description. It is not intended to be exhaustive or to limit the invention to the precise form disclosed. Many modifications and variations are possible in light of the above teaching. For example, while the present disclosure presents methods of testing batteries, the efficient battery tester 100 may be used with any object that accepts bi-directional power flow with a corresponding equivalent model, such as a capacitor or a vehicle's alternator system. It is intended that the scope of the invention not be limited by this detailed description, but by the claims and the equivalents to the claims appended hereto.

What is claimed is:

1. A battery tester for evaluating intrinsic characteristics of a battery, comprising:
   a. at least one sensor for sensing voltage and current;
   b. an energy storage unit for temporarily storing power from the battery, wherein the energy storage unit comprises a supercapacitor;

c. a bi-directional power converter for facilitating energy transfer between the battery and the energy storage unit;

d. a controller for controlling the bi-directional power converter, the controller comprising a processor, a non-transitory computer readable storage medium, and instructions stored in the non-transitory computer readable storage medium, which when executed by the processor cause the processor to perform a battery test method, wherein the battery test method comprises transferring energy from the battery to the energy storage unit and transferring energy from the energy storage unit to the battery using the bi-directional power converter; and e. a display, wherein a user interface on the display provides controls operable for selecting the battery test method;

f. wherein the battery test method is selected from a first test mode for quick evaluation of the battery or a second test mode for precise evaluation of the battery, wherein the first test mode comprises a high current pulse test and the second test mode comprises the high current pulse test and a switching excitation test;

g. wherein the high current pulse test comprises drawing a high current from the battery to the energy storage unit over a short period of time, returning energy from the energy storage unit to the battery, and measuring voltage and current changes using the at least one sensor;

h. wherein the switching excitation test comprises transferring energy from the battery to the energy storage unit and transferring energy from the energy storage unit to the battery at a fixed frequency, and measuring voltage and current using the at least one sensor;

i. wherein the first test mode determines battery internal resistance, cold cranking ampere ("CCA"), and state of charge ("SOC"), wherein battery internal resistance is determined by evaluating $$R = \frac{\Delta V}{\Delta I},$$

wherein $$\frac{\Delta V}{\Delta I}$$

is a change in voltage over a change in current measured in the high current pulse test, wherein CCA is determined by evaluating $$CCA = \frac{f(V_{Terminal} - V_{cutoff})_{temp-correct}}{R},$$

wherein $V_{Terminal}$ is a terminal voltage, $V_{cutoff}$ is a cutoff voltage, and $f(V_{terminal} - V_{cutoff})_{temp-correct}$ is a temperature corrected function of a difference between the terminal voltage and the cutoff voltage, wherein SOC is determined by evaluating $SOC = f(V_{terminal})_{temp-correct}$, wherein $f(V_{Terminal})_{temp-correct}$ is temperature corrected function of the terminal voltage;

j. wherein the second test mode determines the intrinsic characteristics of the battery using a recursive algorithm to increase accuracy of an electrical model of the battery, wherein the recursive algorithm comprises:

i. initializing a set of particles representative of voltage and current of the battery, wherein each particle has a velocity and a position;

ii. updating the set of particles for a number of iterations, wherein updating the set of particles comprises:

1. determining an inaccuracy value of each particle using an inaccuracy function, wherein the inaccuracy function measures a difference between actual battery voltage-current characteristics and an electrical model with estimated intrinsic parameters for a period of time, wherein a particle with a lowest inaccuracy value is considered a best particle of the set of particles, and wherein a particle with a highest inaccuracy value is considered a worst particle of the set of particles, wherein an inaccuracy value of each particle is determined by evaluating function $$\varepsilon_T(P) = \frac{1}{T}\int_0^T |v_{b,act}(t) - v_{b,m}[t, P, i_{b,act}(t)]|dt,$$

wherein $\varepsilon_T$ is a function of a difference between actual battery voltage-current characteristics and an electrical model with estimated intrinsic parameters for a period of time T, wherein $v_{b,act}(t)$ is an actual battery voltage measured at time t, wherein $i_{b,act}(t)$ is an actual battery current measured at time t, wherein $v_{b,m}[t, P, i_{act}(t)]$ is battery voltage at time t calculated using the electrical model with a parameter set P under the actual battery current $i_{b,act}(t)$;

2. generating a replacement particle by generating and injecting a perturbation into the best particle;

3. evaluating an inaccuracy value of the replacement particle using the inaccuracy function;

4. if the replacement particle has a lower inaccuracy value than the best particle, replacing the best particle with the replacement particle in the set of particles, or else replacing the worst particle with the replacement particle in the set of particles; and 5. updating the velocity and the position of each particle in the set of particles; and iii. determining state of charge, cold cranking ampere, and internal resistance of the electrical model of the battery based on the set of particles, whereby the state of charge, cold cranking ampere, and internal resistance are indicative of battery health.

2. The battery tester of claim 1, wherein the battery tester is installed in an automobile to perform an analysis of an automobile battery.

3. The battery tester of claim 1, wherein the battery tester is a standalone device operable to connect with a standalone battery and display test results of the standalone battery.

4. The battery tester of claim 1, wherein the battery tester further comprises a power supply, whereby the power supply supplies energy to the battery tester in order to test a deeply discharged battery.

5. A battery tester for evaluating intrinsic characteristics of a battery, comprising:
- a. at least one sensor for sensing voltage and current;
- b. an energy storage unit for temporarily storing power from the battery, wherein the energy storage unit comprises a supercapacitor;
- c. a bi-directional power converter for facilitating energy transfer between the battery and the energy storage unit;
- d. a controller for controlling the bi-directional power converter, the controller comprising:
  - i. a processor, a non-transitory computer readable storage medium, and instructions stored in the non-transitory computer readable storage medium, which when executed by the processor cause the processor to perform at least one battery test method, wherein the at least one battery test method comprises transferring energy from the battery to the energy storage unit and transferring energy from the energy storage unit to the battery using the bi-directional power converter;
  - ii. wherein the battery tester further comprising a user interface on a display, wherein the user interface comprises controls for selecting the at least one battery test method;
  - iii. wherein the at least one battery test method comprises conducting a high current pulse test, wherein the high current pulse test comprises drawing a high current from the battery to the energy storage unit over a short period of time, returning energy from the energy storage unit to the battery, and measuring voltage and current changes using the at least one sensor;
  - iv. wherein the battery characteristics determined are battery internal resistance, cold cranking ampere ("CCA"), and state of charge ("SOC"), wherein battery internal resistance is determined by evaluating $$R = \frac{\Delta V}{\Delta I},$$

wherein $$\frac{\Delta V}{\Delta I}$$

is a change in voltage over a change in current measured in the high current pulse test, wherein CCA is determined by evaluating $$CCA = \frac{f(V_{Terminal} - V_{cutoff})_{temp-correct}}{R},$$

wherein $V_{Terminal}$ is a terminal voltage, $V_{cutoff}$ is a cutoff voltage, and $f(V_{Terminal} - V_{cutoff})_{temp-correct}$ is a temperature corrected function of a difference between the terminal voltage and the cutoff voltage, wherein SOC is determined by evaluating $SOC = f(V_{Terminal})_{temp-correct}$, wherein $f(V_{Terminal})_{temp-correct}$ is a temperature corrected function of the terminal voltage.

6. The battery tester of claim 5, further comprising determining the intrinsic characteristics of the battery by using a recursive algorithm to increase accuracy of an electrical model of the battery, wherein the recursive algorithm comprises:
- a. initializing a set of particles representative of voltage and current of the battery, wherein each particle has a velocity and a position;
- b. updating the set of particles for a number of iterations, wherein updating the set of particles comprises:
  - i. determining an inaccuracy value of each particle using an inaccuracy function, wherein the inaccuracy function measures a difference between actual battery voltage-current characteristics and an electrical model with estimated intrinsic parameters for a period of time, wherein a particle with a lowest inaccuracy value is considered a best particle of the set of particles, and wherein a particle with a highest inaccuracy value is considered a worst particle of the set of particles;
  - ii. generating a replacement particle by generating and injecting a perturbation into the best particle;
  - iii. evaluating an inaccuracy value of the replacement particle using the inaccuracy function;
  - iv. if the replacement particle has a lower inaccuracy value than the best particle, replacing the best particle with the replacement particle in the set of particles, or else replacing the worst particle with the replacement particle in the set of particles; and
  - v. updating the velocity and the position of each particle in the set of particles; and
- c. determining state of charge, cold cranking ampere, and internal resistance of the electrical model of the battery based on the set of particles.

7. The battery tester of claim 6, wherein determining an inaccuracy value of each particle is determined by evaluating function $\varepsilon_T(P) = 1/T \int_0^T |v_{b,act}(t) - v_{b,m}[t, P, i_{b,act}(t)]| dt$, wherein $\varepsilon_T$ is a function of a difference between actual battery voltage-current characteristics and an electrical model with estimated intrinsic parameters for a period of time T, wherein $v_{b,act}(t)$ is an actual battery voltage measured at time t, wherein $i_{b,act}(t)$ is an actual battery current measured at time t, wherein $v_{b,m}[t, P, i_{act}(t)]$ is battery voltage at time t calculated using the electrical model with a parameter set P under the actual battery current $i_{b,act}(t)$.

8. The battery tester of claim 7, wherein state of charge ("SOC") at time t is determined by evaluating $SOC(t) = SOC(0) + 1/Q_0 \int_0^t i_b(\theta) d\theta$, wherein $SOC(0)$ is the state of charge at a beginning of a period, $Q_0$ is fully charge capacity of the battery, time $i_b(\theta)$ is the battery current at time $\theta$.

9. A battery tester for evaluating intrinsic characteristics of a battery, comprising:
- a. at least one sensor for sensing voltage and current;
- b. an energy storage unit for temporarily storing power from the battery, wherein the energy storage unit comprises a supercapacitor;
- c. a bi-directional power converter for facilitating energy transfer between the battery and the energy storage unit;
- d. a controller for controlling the bi-directional power converter, the controller comprising:
  - i. a processor, a non-transitory computer readable storage medium, and instructions stored in the non-transitory computer readable storage medium, which when executed by the processor cause the processor to perform at least one battery test method, wherein the at least one battery test method comprises transferring energy from the battery to the energy storage unit and transferring energy from the energy storage unit to the battery using the bi-directional power converter;

ii. wherein the battery tester further comprising a user interface on a display, wherein the user interface comprises controls for selecting the at least one battery test method;

iii. wherein the at least one battery test method comprises conducting a high current pulse test, wherein the high current pulse test comprises drawing a high current from the battery to the energy storage unit over a short period of time, returning energy from the energy storage unit to the battery, and measuring voltage and current changes using the at least one sensor; and iv. wherein the at least one battery test method further comprises conducting a switching excitation test, wherein the switching excitation test comprises transferring energy from the battery to the energy storage unit and transferring energy from the energy storage unit to the battery at a fixed frequency, and measuring voltage and current using the at least one sensor.

10. The battery tester of claim 9, further comprising determining the intrinsic characteristics of the battery by using a recursive algorithm to increase accuracy of an electrical model of the battery, wherein the recursive algorithm comprises:

a. initializing a set of particles representative of voltage and current of the battery, wherein each particle has a velocity and a position;

b. updating the set of particles for a number of iterations, wherein updating the set of particles comprises:

i. determining an inaccuracy value of each particle using an inaccuracy function, wherein the inaccuracy function measures a difference between actual battery voltage-current characteristics and an electrical model with estimated intrinsic parameters for a period of time, wherein a particle with a lowest inaccuracy value is considered a best particle of the set of particles, and wherein a particle with a highest inaccuracy value is considered a worst particle of the act of particles;

ii. generating a replacement particle by generating and injecting a perturbation into the best particle, iii. evaluating an inaccuracy value of the replacement particle using the inaccuracy function;

iv. if the replacement particle has a lower inaccuracy value than the best particle, replacing the best particle with the replacement particle in the set of particles, or else replacing the worst particle with the replacement particle in the set of particles; and v. updating the velocity and the position of each particle in the set of particles; and c. determining state of charge, cold cranking ampere, and internal resistance of the electrical model of the battery based on the set of particles.

11. The battery tester of claim 10, wherein determining an inaccuracy value of each particle is determined by evaluating function $$\varepsilon_T(P) = \frac{1}{T}\int_0^T |v_{b,act}(t) - v_{b,m}[t, P, i_{b,act}(t)]|dt,$$

wherein $\varepsilon_T$ is a function of a difference between actual battery voltage-current characteristics and an electrical model with estimated intrinsic parameters for a period of time T, wherein $v_{b,act}(t)$ is an actual battery voltage measured at time t, wherein $i_{b,act}(t)$ is an actual battery current measured at time t, wherein $v_{b,m}[t, P, i_{act}(t)]$ is battery voltage at time t calculated using the electrical model with a parameter set P under the actual battery current $i_{b,act}(t)$.

12. The battery tester of claim 11, wherein state of charge ("SOC") at time t is determined by evaluating $$SOC(t) = SOC(0) + \frac{1}{Q_o}\int_0^t i_b(\theta)d\theta,$$

wherein SOC(0) is the state of charge at a beginning of a period, $Q_0$ is fully charge capacity of the battery, time $i_b(\theta)$ is the battery current at time $\theta$.

13. A method of testing batteries for intrinsic characteristics, the method comprising:

at a circuit having a controller, a bi-directional power converter, an energy storage unit, and at least one sensor, wherein the energy storage unit comprises a supercapacitor:

a. performing a battery test method, wherein the battery test method comprises:

i. recording a voltage and current of a battery;

ii. directing the controller to transfer energy from the battery to the energy storage unit using the bi-directional power converter;

iii. directing the controller to transfer energy from the energy storage unit to the battery using the bi-directional power converter; and iv. measuring voltage and current of the circuit using the at least one sensor;

b. determining intrinsic characteristics of the battery based on measured voltage and current of the circuit;

c. the method for testing batteries further comprising providing a user interface on a display, wherein the user interface provides a selection of battery test methods to perform on the battery;

d. wherein the selection of battery test methods comprises a first battery test method to simulate a high current pulse, wherein the step of directing the controller to transfer energy from the battery to the energy storage unit using the bi-directional power converter is conducted over a short period of time; and e. wherein the intrinsic characteristics comprise battery internal resistance, cold cranking ampere ("CCA"), and state of charge ("SOC"), wherein battery internal resistance is determined by evaluating $$R = \frac{\Delta V}{\Delta I},$$

wherein $$\frac{\Delta V}{\Delta I}$$

is a change in voltage over a change in current measured in the high current pulse test, wherein CCA is determined by evaluating $$CCA = \frac{f(V_{Terminal} - V_{cutoff})_{temp-correct}}{R},$$

wherein $V_{Terminal}$ is a terminal voltage, $V_{cutoff}$ is a cutoff voltage, and $f(V_{Terminal}-V_{cutoff})_{temp-correct}$ is a temperature corrected function of a difference between the terminal voltage and the cutoff voltage, wherein SOC is determined by evaluating $SOC=f(V_{Terminal})_{temp-correct}$, wherein $f(V_{Terminal})_{temp-correct}$ is a temperature corrected function of the terminal voltage.

14. The method for testing batteries of claim 13, wherein determining intrinsic characteristics of the battery comprises using a recursive algorithm to increase accuracy of an electrical model of the battery, wherein the recursive algorithm comprises:
   a. Initializing a set of particles representative of voltage and current of the battery, wherein each particle has a velocity and a position;
   b. updating the set of particles for a number of iterations, wherein updating the set of particles comprises:
      i. determining an inaccuracy value of each particle using an inaccuracy function, wherein the inaccuracy function measures a difference between actual battery voltage-current characteristics and an electrical model with estimated intrinsic parameters for a period of time, wherein a particle with a lowest inaccuracy value is considered a best particle of the set of particles, and wherein a particle with a highest inaccuracy value is considered a worst particle of the set of particles;
      ii. generating a replacement particle by generating and injecting a perturbation into the best particle;
      iii. evaluating an inaccuracy value of the replacement particle using the inaccuracy function;
      iv. if the replacement particle has a lower inaccuracy value than the best particle, replacing the best particle with the replacement particle in the set of particles, or else replacing the worst particle with the replacement particle in the set of particles; and
      v. updating the velocity and the position of each particle in the set of particles; and
   c. determining state of charge, cold cranking ampere, and internal resistance of the electrical model of the battery based on the set of particles.

15. The method for testing batteries of claim 14, wherein determining an inaccuracy value of each particle is determined by evaluating function $\varepsilon_T(P)=1/T\int_0^T |v_{b,act}(t)-v_{b,m}[t, P, i_{b,act}(t)]|dt$, wherein $\varepsilon_T$ is a function of a difference between actual battery voltage-current characteristics and an electrical model with estimated intrinsic parameters for a period of time T, wherein $v_{b,act}(t)$ is an actual battery voltage measured at time t, wherein $i_{b,act}(t)$ is an actual battery current measured at time t, wherein $v_{b,m}[t, P, i_{act}(t)]$ is battery voltage at time t calculated using the electrical model with a parameter set P under the actual battery current $i_{b,act}(t)$.

16. The method for testing batteries of claim 15, wherein state of charge ("SOC") at time t is determined by evaluating $SOC(t)=SOC(0)+1/Q_0\int_0^t i_b(\theta)d\theta$, wherein SOC(0) is the state of charge at a beginning of a period, $Q_0$ is a fully charge capacity of the battery, and time $i_b(\theta)$ is the battery current at time $\theta$.

17. A method of testing batteries for intrinsic characteristics, the method comprising:
at a circuit having a controller, a bi-directional power converter, an energy storage unit, and at least one sensor, wherein the energy storage unit comprises a supercapacitor:
   a. performing a battery test method, wherein the battery test method comprises:
      i. recording a voltage and current of a battery;
      ii. directing the controller to transfer energy from the battery to the energy storage unit using the bi-directional power converter;
      iii. directing the controller to transfer energy from the energy storage unit to the battery using the bi-directional power converter; and
      iv. measuring voltage and current of the circuit using the at least one sensor:
   b. determining intrinsic characteristics of the battery based on measured voltage and current of the circuit;
   c. the method for testing batteries further comprising providing a user interface on a display, wherein the user interface provides a selection of battery test methods to perform on the battery;
   d. wherein the selection of battery test methods comprises a first battery test method to simulate a high current pulse, wherein the step of directing the controller to transfer energy from the battery to the energy storage unit using the bi-directional power converter is conducted over a short period of time; and
   e. wherein the selection of battery test methods comprises a second battery test method to simulate switching excitation, wherein the steps of directing the controller to transfer energy from the battery to the energy storage unit and from the energy storage unit to the battery are performed at a fixed frequency.

18. The method for testing batteries of claim 17, wherein determining intrinsic characteristics of the battery comprises using a recursive algorithm to increase accuracy of an electrical model of the battery, wherein the recursive algorithm comprises:
   a. initializing a set of particles representative of voltage and current of the battery, wherein each particle has a velocity and a position;
   b. updating the set of particles for a number of iterations, wherein updating the set of particles comprises:
      i. determining an inaccuracy value of each particle using an inaccuracy function, wherein the inaccuracy function measures a difference between actual battery voltage-current characteristics and an electrical model with estimated intrinsic parameters for a period of time, wherein a particle with a lowest inaccuracy value is considered a best particle of the set of particles, and wherein a particle with a highest inaccuracy value is considered a worst particle of the set of particles;
      ii. generating a replacement particle by generating and injecting a perturbation into the best particle;
      iii. evaluating an inaccuracy value of the replacement particle using the inaccuracy function;
      iv. if the replacement particle has a lower inaccuracy value than the best particle, replacing the best particle with the replacement particle in the set of particles, or else replacing the worst particle with the replacement particle in the set of particles; and
      v. updating the velocity and the position of each particle in the set of particles; and c. determining state of charge, cold cranking ampere, and internal resistance of the electrical model of the battery based on the set of particles.

19. The method for testing batteries of claim 18, wherein determining an inaccuracy value of each particle is determined by evaluating function $$\varepsilon_T(P) = \frac{1}{T}\int_0^T |v_{b,act}(t) - v_{b,m}[t, P, i_{b,act}(t)]| dt,$$

wherein $\varepsilon_T$ is a function of a difference between actual battery voltage-current characteristics and an electrical model with estimated intrinsic parameters for a period of time T, wherein $v_{b,act}(t)$ is an actual battery voltage measured at time t, wherein $i_{b,act}(t)$ is an actual battery current measured at time t, wherein $v_{b,m}[t, P, i_{act}(t)]$ is battery voltage at time t calculated using the electrical model with a parameter set P under the actual battery current $i_{b,act}(t)$.

20. The method for testing batteries of claim 19, wherein state of charge ("SOC") at time t is determined by evaluating $$SOC(t) = SOC(0) + \frac{1}{Q_o}\int_0^t i_b(\theta) d\theta,$$

wherein SOC(0) is the state of charge at a beginning of a period, $Q_0$ is a fully charge capacity of the battery, and time $i_b(\theta)$ is the battery current at time $\theta$.

* * * * *